(12) United States Patent
Yang et al.

(10) Patent No.: US 8,013,484 B2
(45) Date of Patent: Sep. 6, 2011

(54) COOLING APPARATUS

(75) Inventors: Chih-Hao Yang, Taipei Hsien (TW); Che-Cheng Hu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 330 days.

(21) Appl. No.: 12/125,942

(22) Filed: May 23, 2008

(65) Prior Publication Data

US 2008/0289803 A1    Nov. 27, 2008

(30) Foreign Application Priority Data

May 25, 2007    (CN) .......................... 2007 1 0200708

(51) Int. Cl.
*H02K 9/00*    (2006.01)

(52) U.S. Cl. ......... 310/59; 310/60 R; 417/354; 417/353; 417/423.1

(58) Field of Classification Search ............. 310/52–64; 361/698, 699; 417/353, 354, 423.1
See application file for complete search history.

(56) References Cited

U.S. PATENT DOCUMENTS

| 4,908,538 A * | 3/1990 | Geberth, Jr. .................... 310/59 |
| 7,057,894 B2 | 6/2006 | Chang |
| 7,092,254 B1 | 8/2006 | Monsef et al. |
| 7,544,049 B2 * | 6/2009 | Koga et al. ................. 417/423.8 |
| 2002/0094281 A1 * | 7/2002 | Khanwilkar et al. ......... 417/356 |
| 2004/0240179 A1 * | 12/2004 | Koga et al. .................... 361/699 |
| 2005/0012411 A1 * | 1/2005 | Hoffman et al. ................ 310/63 |
| 2006/0023425 A1 * | 2/2006 | Iijima et al. .................... 361/699 |
| 2007/0103869 A1 * | 5/2007 | Liu et al. ........................ 361/699 |
| 2008/0284263 A1 * | 11/2008 | Dessirier ......................... 310/54 |

FOREIGN PATENT DOCUMENTS

WO    WO 2006010863 A1 *    2/2006

* cited by examiner

*Primary Examiner* — Quyen Leung
*Assistant Examiner* — Leda Pham
(74) *Attorney, Agent, or Firm* — Altis Law Group, Inc.

(57) ABSTRACT

A cooling apparatus is for dissipating heat from an electronic device. The cooling apparatus includes a casing, an impeller, and a motor. The casing is for absorbing the heat and allowing coolant to flow therein. The impeller is received in the casing. The motor is received in the casing, and is for providing a force to drive the impeller to rotate to force the coolant to flow. The coolant flows between the casing and the motor to take the heat away.

18 Claims, 4 Drawing Sheets

COOLING APPARATUS

BACKGROUND

1. Field of the Invention

The present invention generally relates to cooling apparatuses, and particularly to a cooling apparatus utilizing coolant flow and agitation.

2. Description of Related Art

In the past, heat generated by a typical central processing unit (CPU) of a computer can be adequately removed by a conventional cooling apparatus utilizing heat sinks and air fans. However, because of recent advances in technology, chip density and CPU speed have increased resulting in more heat being given off by the CPU, as such the conventional cooling apparatus can no longer efficiently remove heat from the CPU.

In order to increase the efficiency in removing heat, coolant such as water is used to help cool the CPU. A coolant-cooling apparatus uses a circulating channel between a heat source and a heat-dissipation part, and the coolant flows in the circulating channel. The coolant absorbs heat from the heat source, and transports the heat to the heat-dissipation part. The heat-dissipation part dissipates the heat to air. Furthermore, the coolant-cooling apparatus also utilizes a pump to drive the coolant to flow circularly in the circulating channel.

However, the heat source, the heat-dissipation part, and the pump are disposed independently from each other in different position along the circulating channel, resulting in the coolant-cooling apparatus occupying valuable space in the computer. Thus, the coolant-cooling apparatus occupying a large space in a computer is and will be a shortcoming as the computer gets smaller.

Therefore, improvements for a cooling apparatus are needed in the industry to address the aforementioned deficiency.

SUMMARY

A cooling apparatus is for dissipating heat from an electronic device. The cooling apparatus includes a casing, an impeller, and a motor. The casing is for absorbing the heat and allowing coolant to flow therein. The impeller is received in the casing. The motor is received in the casing, and is for providing a force to drive the impeller to rotate to force the coolant to flow. The coolant flows between the casing and the motor to take the heat away.

Other advantages and novel features of the present invention will become more apparent from the following detailed description of preferred embodiment when taken in conjunction with the accompanying drawings.

DETAILED DESCRIPTION

Reference will now be made to the drawings to describe a preferred embodiment of the present cooling apparatus.

Figure 1:
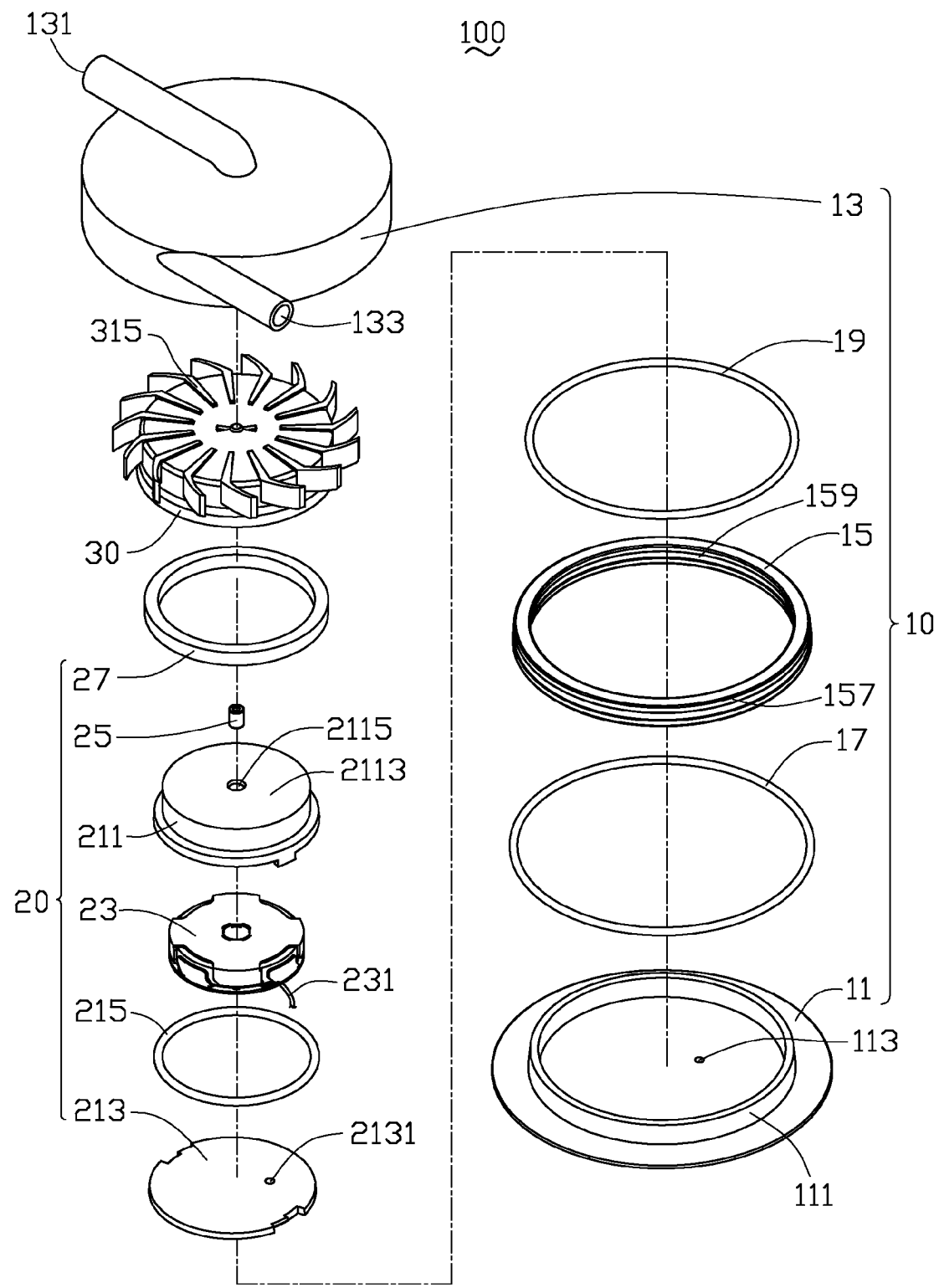
FIG. 1 is a disassembled view of a cooling apparatus in accordance with an exemplary embodiment.
Figure 2:
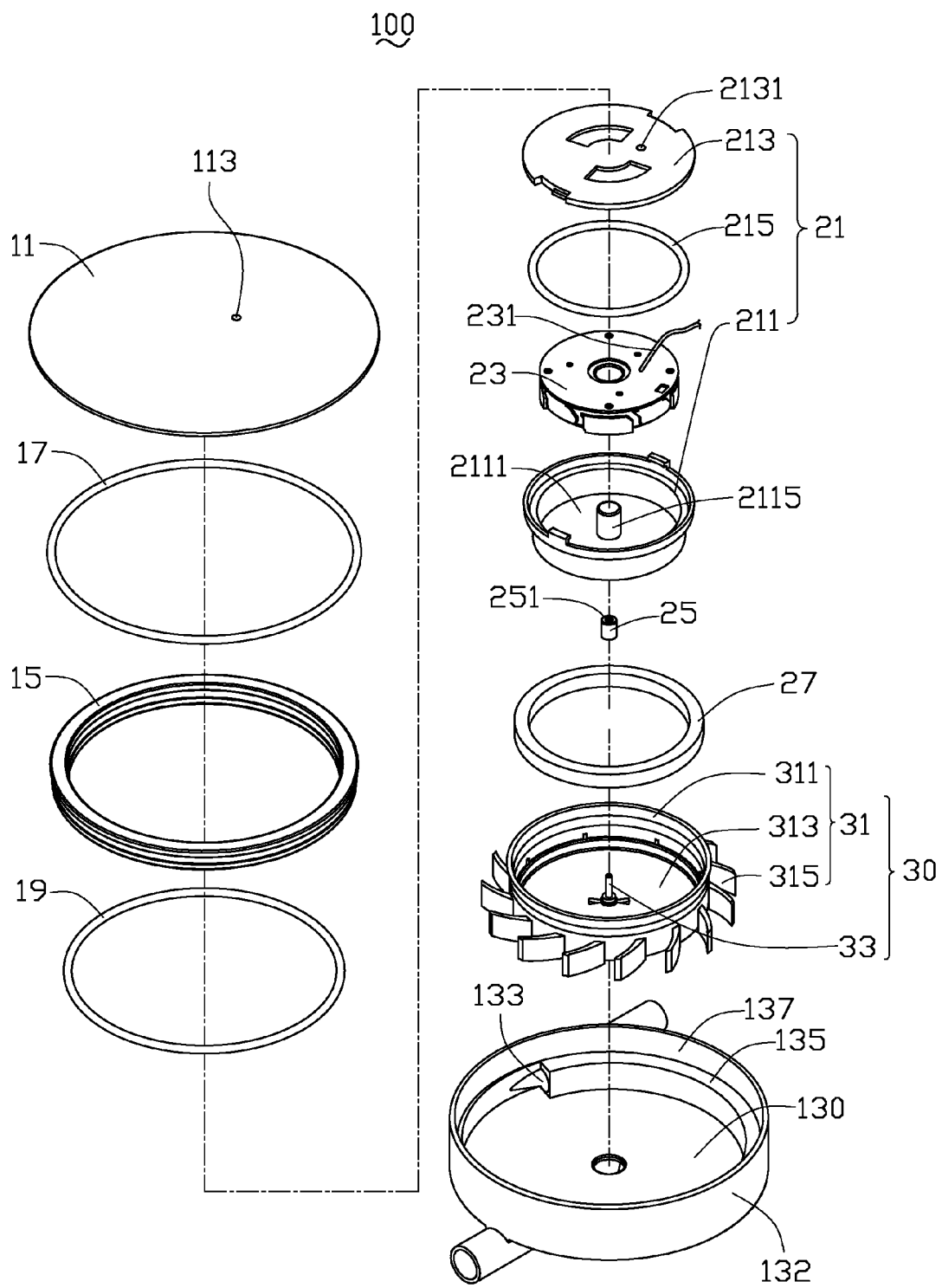
FIG. 2 is disassembly view of the cooling apparatus of FIG. 1, viewed from another side.
Figure 4:
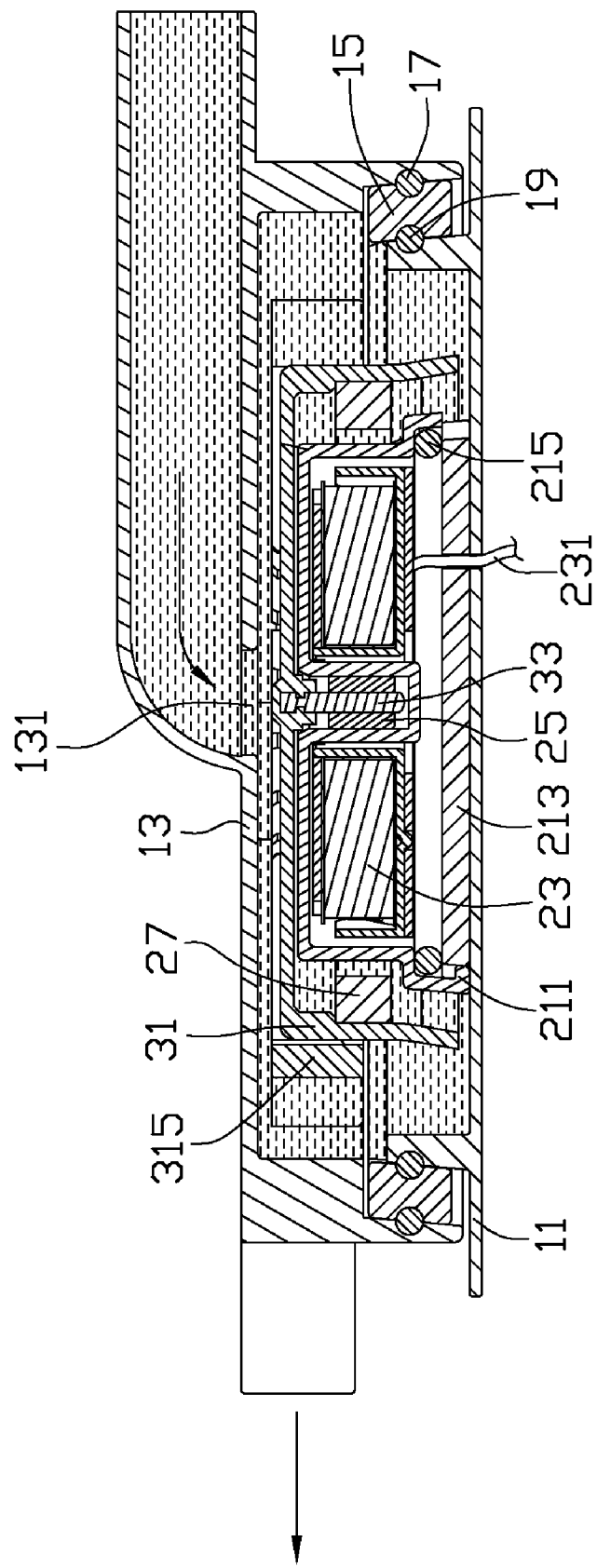
FIG. 4 is a cross-sectional view taken along line IV-IV of FIG. 3.

Referring to FIGS. 1, 2, 4, a cooling apparatus 100 in accordance with an exemplary embodiment is used to cool a central processing unit (CPU) (not shown) using water as coolant. The cooling apparatus 100 includes a casing 10, a motor 20, and an impeller 30. The motor 20 and the impeller 30 are received in the casing 10. The coolant is received in a space enclosed between the casing 10 and the motor 20. The motor 20 is configured for rotating the impeller 30. A plurality of vanes 315 is formed on the circular periphery of the impeller 20. When the motor 20 rotates, it drives the impeller 30 to also rotate, thus the coolant is forced by the vanes 315 to flow.

The casing 10 includes a base 11, a lid 13, a sealed loop 15, an inner gasket 17, and an outer gasket 19. The base 11 is used for contacting with the CPU to absorb heat from the CPU, and supporting the other components. The lid 13 is used for cooperating with the base 11 to enclose the motor 20 and the impeller 30.

The base 11 includes an annular wall 111 to position the lid 13. The lid 13 includes a circular top board 130, a hollow cylindrical sidewall 132 with an inner side surface 137. The sidewall 132 surrounds the top board 130 and perpendicularly connects with the top board 130. The lid 13 further includes an intake 131 by which the coolant is admitted into the casing 10, and an outlet 133 through which the coolant flows out of the casing 10. The intake 131 is defined in the center of the top board 130 for connecting a water pipe (not labeled). The outlet 133 is defined in the sidewall 132 for connecting another water pipe (not labeled). A speedup member 135 is mounted at the joint between the top board 130 and the sidewall 132. The speedup member 135 extends surrounding the inner side surface 137, and the thickness thereof gradually decreases from one end defining the outlet 133 to the other end, thus the thickness of the other end is zero. The sealed loop 15, the inner gasket 17, and the outer gasket 19 are clamped between the annular wall 111 and the lid 13 to prevent the coolant from flowing out of the casing 10.

The sealed loop 15 defines an outer recess 157 in its outer side surface (not labeled) and an inner recess 159 in its inner side surface (not labeled). The inner gasket 17 is embedded in the inner recess 159 and is sleeved around the annular wall 111. The outer gasket 19 is sleeved on the outer recess 157 and is compacted against the inner side surface 137 of the lid 13. The base 11 also defines a first hole 113 within a range of the annular wall 111 for leading an electrical wire 231 (referring to FIG. 4) to pass therethrough. In the embodiment, the electrical wire 231 is used to transmit electrical signals to the motor 20.

The motor 20 includes a sealed device 21, a drive coil 23 received in the sealed device 21, a bearing 25, and an annular magnet 27 sleeved around the sealed device 21. The annular magnet 27 can be rotated with respected to the sealed device 21.

The sealed device 21 includes a first cap 211, a supporting board 213 cooperating with the first cap 211 to protect the drive coil 23 from the coolant, and an annular gasket 215 elastically clamped between the first cap 211 and the supporting board 213 to closely seal a gap therebetween. The supporting board 213 defines a second hole 2131 corresponding to the first hole 113. The electrical wire 231 is electrically connected to the drive coil 23 through the second hole 2131. Therefore, the drive coil 23 is protected from the coolant using a combination of the first cap 211, the supporting board 213, and the annular gasket 215.

The first cap 211 includes an inner lid surface 2111, an outer lid surface 2113, and a bearing housing 2115 formed in the center of the inner lid surface 2111 and the center of the outer lid surface 2113. When viewed from a side of the inner lid surface 2111, the bearing housing 2115 extends vertically from the center of the inner lid surface 2111 as a post, while viewed from a side of the outer lid surface 2113, the bearing housing 2115 is recessed downwardly from the center of the outer surface 2113 to define a cavity thereof.

The drive coil 23 sleeves around the bearing housing 2115 via a guiding hole (not labeled) in the center of the drive coil 23. The bearing 25 is received in the bearing housing 2115. The annular magnet 27 is tightly wedged into the impeller 30.

The impeller 30 includes a second cap 31 and a shaft 33 protruding vertically from the center of a coping 313 of the second cap 31. The second cap 31 includes the coping 313, an annular wall 311 extending downwardly from the coping 313, and the vanes 315 formed on circular periphery of the annular wall 311. The annular magnet 27 of the motor 20 is tightly wedged into the second cap 31. When the motor 20 operates, the annular magnet 27 is driven by a magnetic force generated by the drive coil 23 to rotate, thereby the second cap 31 is also rotated with the annular magnet 27. The shaft 33 passes through a through hole 251 of the bearing 25.

Therefore, the bearing housing 2115 of the sealed device 21, the bearing 25, and the shaft 33 of the impeller 30 collectively form a rotatable device to help the impeller 30 rotate with respect to the sealed device 21.

Figure 3:
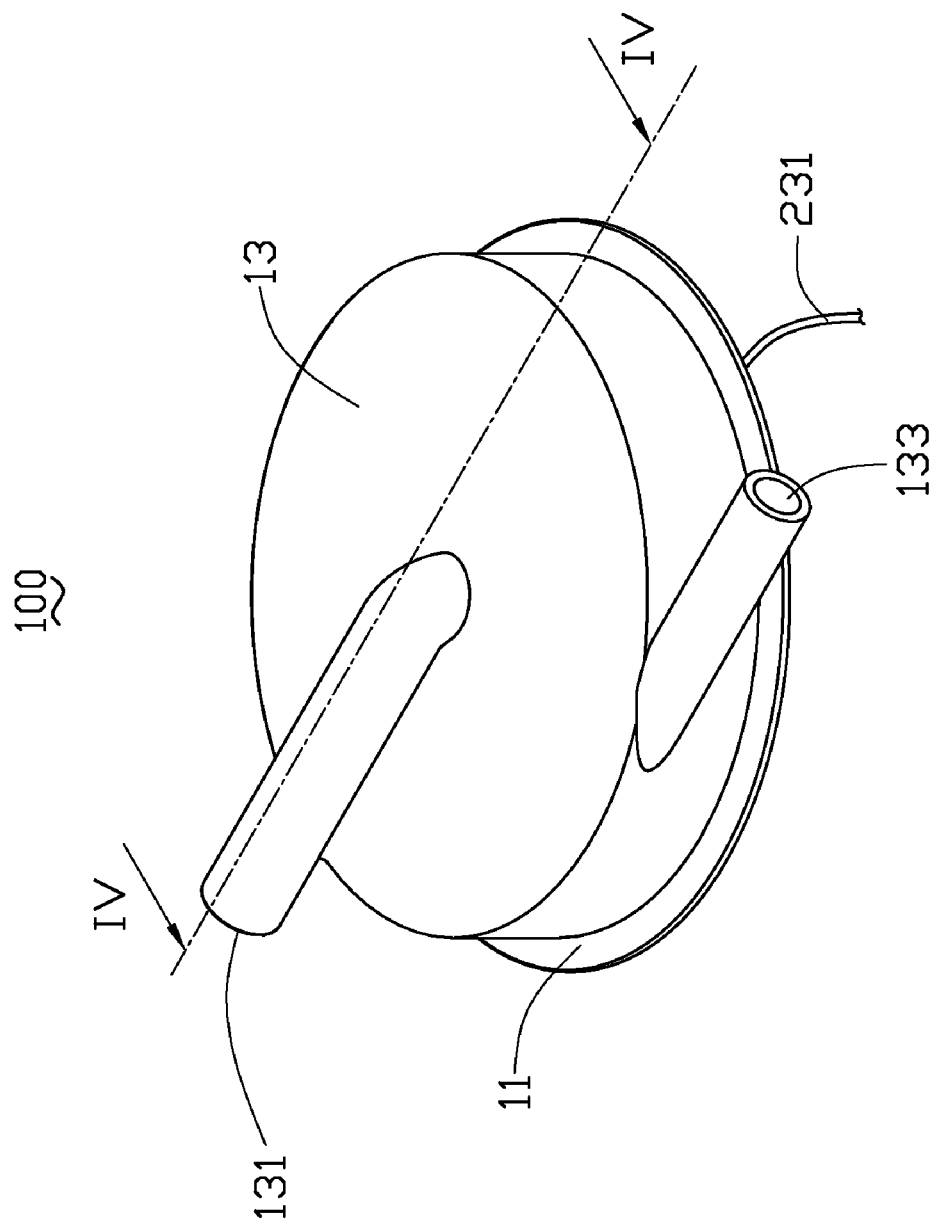
FIG. 3 is an assembly view of the cooling apparatus of FIG. 1.

In operation, referring to FIGS. 3, 4, the coolant flows into the casing 10 via the intake 131, and fills up a space between the casing 10 and the sealed device 21. Power is supplied to the drive coil 23, and the drive coil 23 generates the magnetic force to rotate the annular magnet 27. Then the second cap 31 is rotated by the annular magnet 27, thus the vanes 315 rotates and pushes the coolant to flow. The cooling apparatus 100 is set on the CPU, with the base 11 closely attached to the CPU to absorb the heat generated from the CPU. The coolant takes the heat away from the base 11, and flows out of the casing 10 via the outlet 133.

As mentioned above, the cooling apparatus 100 utilizes the casing 10 to absorb the heat, and utilizes the motor 20 to force the coolant to take the heat away, and especially the motor 20 is received in the casing 10. Therefore, the cooling apparatus 100 has a comparative small size that can be used in computers with small footprints. Furthermore, the thickness of the speedup member 135 gradually decreases to zero along the rotation direction of the impeller 30, thus the outlet 133 faces the flow direction of the coolant to accelerate the speed of the coolant flowing out of the casing 10 from the outlet 133.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A cooling apparatus for dissipating heat from an electronic device, comprising:
    a casing for absorbing the heat and allowing coolant to flow therein, the casing having a speedup member therein;
    an impeller received in the casing; and
    a motor received in the casing, for providing a force to drive the impeller to rotate to force the coolant to flow;
    wherein the coolant flows between the casing and the motor to take the heat away;
    wherein the thickness of the speedup member gradually decreases along the rotation direction of the impeller, the speedup member is capable of accelerating the speed of the coolant flowing out of the casing.

2. The cooling apparatus according to claim 1, wherein the motor comprises a drive coil to generate a magnetic force when receiving power, and a sealed device for sealing the drive coil from the coolant.

3. The cooling apparatus according to claim 2, wherein the sealed device comprises a supporting board for supporting the drive coil, a cap for covering the drive coil, and an annular gasket elastically clamped between the supporting board and the cap to protected the drive coil from the coolant.

4. The cooling apparatus according to claim 3, wherein the supporting board defines a hole to allow an electrical wire passing therethrough.

5. The cooling apparatus according to claim 3, wherein the cap comprises an inner lid surface and a post extending vertically from the center of the inner lid surface, and the drive coil sleeves around the post.

6. The cooling apparatus according to claim 2, wherein the motor comprises an annular magnet sleeving around the sealed device, and the annular magnet is rotated with respect to the sealed device.

7. The cooling apparatus according to claim 6, wherein the sealed device comprises a bearing housing for receiving a bearing.

8. The cooling apparatus according to claim 7, wherein the impeller comprises a cap and the annular magnet is tightly wedged into the cap to be rotated by the magnetic force.

9. The cooling apparatus according to claim 8, wherein the impeller comprises a shaft protruding vertically from the center of a coping of the cap to pass through a through hole of the bearing.

10. The cooling apparatus according to claim 8, wherein the cap comprises a coping, an annular wall extending downwardly from the coping, and a plurality of vanes formed on circular periphery of the annular periphery of the annular wall.

11. A cooling apparatus for dissipating heat from an electronic device, the cooling apparatus comprising:
    a casing for absorbing the heat and allowing a coolant to flow therein, the case having a speedup member therein, an intake by which the coolant is admitted into the casing, and an outlet through which the coolant flows out of the casing;
    a drive coil received in the casing, for generating a magnetic force;
    a sealed device received in the casing, for sealing the drive coil from the coolant; and
    a rotatable module received in the casing, for being rotated by the magnetic force with respect to the sealed device to agitate the coolant;
    wherein the coolant flows between the casing and the sealed device to take the heat away;
    wherein the speedup member extends surrounding an inner side surface of the casing, and the thickness of the speedup member gradually decreases from one end defining the outlet to the other end, thus the outlet faces the flow direction of the coolant to accelerate the speed of the coolant flowing out of the casing from the outlet.

12. The cooling apparatus according to claim 11, wherein the thickness of the other end of the speedup member is zero.

13. The cooling apparatus according to claim 11, wherein the casing comprises a base for contacting with the electronic device to absorb the heat, and a lid covering the sealed device and the rotatable module.

14. The cooling apparatus according to claim 13, wherein the base comprises an annular wall to position the lid.

15. The cooling apparatus according to claim 14, wherein the casing comprises a sealed loop, an inner gasket, and an outer gasket clamped between the annular wall and the lid to prevent the coolant from flowing out of the casing.

16. The cooling apparatus according to claim 15, wherein the inner gasket is embedded in an inner recess defined in an inner side surface of the sealed loop, and the outer gasket is sleeved around an outer recess.

17. The cooling apparatus according to claim 11, wherein the rotatable module comprises an impeller and an annular magnet tightly wedged into the impeller, and the annular magnet is for being rotated by the magnetic force with respect to the sealed device.

18. A cooling apparatus for dissipating heat from an electronic device, comprising:
- a casing for absorbing the heat and allowing coolant to flow therein, the casing having a speedup member therein;
- an impeller received in the casing which being driven to rotate to force the coolant to flow;

wherein the thickness of the speedup member gradually decreases along the rotation direction of the impeller, wherein the casing comprises an intake by which the coolant is admitted into the casing, and an outlet through which the coolant flows out of the casing, the outlet is defined in the thicker end of the speedup member;

wherein the casing further comprises a top board, and a hollow sidewall surrounding the top board and perpendicularly connecting with the top board, the speedup member is mounted at the joint between the top board and the sidewall, the speedup member extends surrounding an inner side surface of the sidewall, and the thickness thereof gradually decreases from one end defining the outlet to the other end, thus the thickness of the other end is zero.

* * * * *